(12) United States Patent
Den Hartog et al.

(10) Patent No.: US 9,143,418 B2
(45) Date of Patent: Sep. 22, 2015

(54) NETWORK TRANSMISSION CAPACITY MEASUREMENT

(75) Inventors: Frank Theodoor Henk Den Hartog, Zoeterwoude (NL); Archi Delphinanto, Delft (NL); Floris Peter Nicolai, Amsterdam (NL)

(73) Assignee: Nederlandse Organisatie voor toegepast-natuurwetenschappelijk ondezoek TNO, Delft (NL)

( * ) Notice: Subject to any disclaimer, the term of this patent is extended or adjusted under 35 U.S.C. 154(b) by 559 days.

(21) Appl. No.: 13/383,674

(22) PCT Filed: Jul. 13, 2010

(86) PCT No.: PCT/NL2010/050453
§ 371 (c)(1),
(2), (4) Date: May 7, 2012

(87) PCT Pub. No.: WO2011/008090
PCT Pub. Date: Jan. 20, 2011

(65) Prior Publication Data
US 2013/0016620 A1    Jan. 17, 2013

(30) Foreign Application Priority Data
Jul. 13, 2009  (EP) .................................... 09165352

(51) Int. Cl.
*G01R 31/08* (2006.01)
*H04L 12/26* (2006.01)

(52) U.S. Cl.
CPC ............ *H04L 43/0882* (2013.01); *G01R 31/08* (2013.01); *H04L 43/0864* (2013.01); *H04L 43/12* (2013.01)

(58) Field of Classification Search
CPC .......... H04L 12/26; H04L 29/08; H04L 12/56
USPC ................... 370/252–255, 221; 455/423; 709/241–248
See application file for complete search history.

(56) References Cited

U.S. PATENT DOCUMENTS

| 7,519,086 | B2 | 4/2009 | Liu et al. |
| 2007/0115814 | A1 * | 5/2007 | Gerla et al. ................... 370/230 |

(Continued)

FOREIGN PATENT DOCUMENTS

| EP | 0522211 A1 * | 6/1991 | .............. H04L 12/26 |
| EP | 0522211 A1 | 1/1993 | |

(Continued)

OTHER PUBLICATIONS

Bandwidth Estimation: Metrics, Measurement Techniques, and Tools, Ravi Prasad and Constantinos Dovrolis, Georgia Institute of Technology Margaret Murray and kc claffy, Cooperative Association for Internet Data Analysis (CAIDA), IEEE Network • Nov./Dec. 2003.

(Continued)

*Primary Examiner* — Iqbal Zaidi
(74) *Attorney, Agent, or Firm* — Banner & Witcoff, Ltd.

(57) ABSTRACT

Transmission capacity from a first node to a second node through a communication network is measured. First and second probe message from the first node to the second node, a first and second amount of data in the first and second probe message respectively being mutually different, at least one of the first and second amount exceeding a fragmentation threshold of the communication network. First and second round trip time durations are measured between transmission of the first and second probe message from the first node and reception back at the first node of a first and second response message from the second node to the first and second probe message respectively. The capacity is computed from a difference between the first and second round trip time duration.

13 Claims, 2 Drawing Sheets

(56) References Cited

U.S. PATENT DOCUMENTS

2008/0056163 A1* 3/2008 Chan et al. .................. 370/255
2008/0098124 A1* 4/2008 Vaughan et al. ............ 709/231

FOREIGN PATENT DOCUMENTS

| WO | 2008127154 A1 | 10/2008 |
| WO | WO2008127154 | * 10/2008 |
| WO | WO2009087030 | * 7/2009 |

OTHER PUBLICATIONS

F.P. Nicolai, "Capacity Measurement in 1-15 small-scale heterogeneous best-effort IP networks", THESIS, Jul. 2, 2009, TNO, TUDELFT, retrieved from: http://repository.tudelft.nl/assets/uuid:26b150ce-6a62-45c4-854a-bf49d7666d24/Final_thesis.pdf.

Carter R L et al., "Measuring bottleneck speed in packet-switched networks", 18th International Symposium on Information Process System Modeling, Measurement and Evaluation, Oct. 1996, pp. 297-318, vol. 27-28.

* cited by examiner

NETWORK TRANSMISSION CAPACITY MEASUREMENT

CROSS-REFERENCE TO RELATED APPLICATIONS

This application is a U.S. National Stage application under 35 U.S.C. §371 of International Application PCT/NL2010/050453 (published as WO 2011/008090 A1), filed Jul. 13, 2010, which claims priority to European Patent Application EP 09165352.7, filed Jul. 13, 2009. Benefit of the filing date of each of these prior applications is hereby claimed. Each of these prior applications is hereby incorporated by reference in its entirety.

FIELD OF THE INVENTION

The invention relates to a method and system for measuring transmission capacity of a communication network and method and system for measuring controlling tasks that use the communication network.

BACKGROUND

Available transmission capacity is an important parameter for controlling use of a communication network. For example, when a device has received a request to transmit a stream of video data, information about available transmission capacity can be used to control the quality level and resulting bandwidth of the stream or to generate an error message if the available transmission capacity is insufficient.

Information about available transmission capacity is not always directly available in every device that uses the network. The network may comprise many layers of software and hardware that make the underlying transmission capacity invisible to devices that operate in higher layers.

US 2007/0115814 describes various techniques for measuring network capacity. One technique involves transmission at increasing data rate until it is detected that the limits of available capacity have been reached, e.g. when packet losses increase. Another technique involves measurement of round trip delay time (RTT) as a function of data rate. In this technique packets are transmitted from a sender to a receiver and the receiver transmits back acknowledgements. The ratio between the amount of data sent and time duration between acknowledgements is used as a measure of capacity.

A further technique involves measurement of "packet pair dispersion". In this technique a first and second packet are transmitted at time points separated by a first (minimal) time interval and the duration of a second time interval between the time points of arrival of the packets is measured. The packet pair dispersion, i.e. the difference between the durations of the first and second time intervals can be used as a measure of capacity. US 2007/0115814 describes a technique, called "Capprobe" wherein a plurality of such pairs are transmitted and the dispersion is used to select pairs that have been transmitted unhindered by other traffic, using the transmission delays of the packets in the selected pairs as a measure of capacity.

EP 522211 describes a method of determining network bandwidth from a slope of a graph of mean transmission delay versus packet size, which is a straight line. The document notes that the line mage be fragmented when the length of the packet exceeds an internal size of of one or more network links. The document notes that the location of the discontinuity can be used to determine the internal packet size. The document shows the slope disregarding the discontinuity, using successive line fragments with the same slope. The bandwidth is determined from the slope. EP 522211 contains no suggestion that the ratio of mean transmission delay difference and packet size difference between points on mutually opposite sides of the discontinuity has any significance.

Many of the known techniques have the disadvantage that they involve software or hardware that is specifically adapted to implement the technique on both the sender and receiver side. This may not be feasible when the sender and the receiver are controlled by different parties. In that case a technique must be used that involves specific adaptations on one side only, typically on the sender side, using round trip. However, in that case it may be become uncertain how much of the delay must be attributed to transmission

SUMMARY

Among others, it is an object to provide for measurement of network capacity between a first and second node wherein the measurement can be controlled by the first node and in which message response traffic back from the second node to the first node does not affect the measurement result.

A method according to claim 1 is provided. Herein probe messages with mutually different amounts of data are used to probe network capacity. The amount of data in at least one of the probe messages exceeds the fragmentation threshold of the network, that is, the maximum amount of data that can be transferred with one signal packet through the network. In this way it is ensured that back to back signal packets are generated for executing a packet pair dispersion measurement without risking that timing of the earliest signal packet and a response to the probe message interfere with each other.

The method may be applied to a communication network that comprises a wireless network in a communication path between the first node and the second node. In this case the wireless network may be the network bottleneck and the capacity computation can be used to estimate its capacity. A wireless network may be used wherein simultaneous signal back and forth between the nodes are impossible. The method also works when the network is asymmetric, e.g. with a higher capacity for transmission in one direction than in the opposite direction.

In an embodiment first and second probe messages are transmitted repeatedly and the network capacity is computed from a difference between the minimal values of first and second round trip time duration for the first and second probe messages. In this way the effects of other traffic on the capacity measurement are minimized.

In an embodiment the first and second probe messages are addressed to an inactive port of the second node. Thus a control device according to any one of claim 8 or 9, is provided wherein the processing circuit is configured to address first and second probe messages to an inactive port of the node, and to use error messages that report that the port is inactive as the first and second response message. Thus it is ensured that short fixed error messages of the same length are elicited in response to the first and second probe messages. In this way differences in the effect of the return transmission on the round trip time duration are minimized.

In an embodiment Universal Datagram Protocol (UDP) messages are used as probe messages. This has the advantage that the messages can be controlled from the first node and that disturbance by acknowledgements, retransmissions or rate adaptations are avoided.

In an embodiment the computed capacity is used to control a bit rate of a video stream.

BRIEF DESCRIPTION OF THE DRAWING

These and other object and advantageous aspects will become apparent from a description of exemplary embodiments, using the following figures

DETAILED DESCRIPTION OF EXEMPLARY EMBODIMENTS

Figure 1:
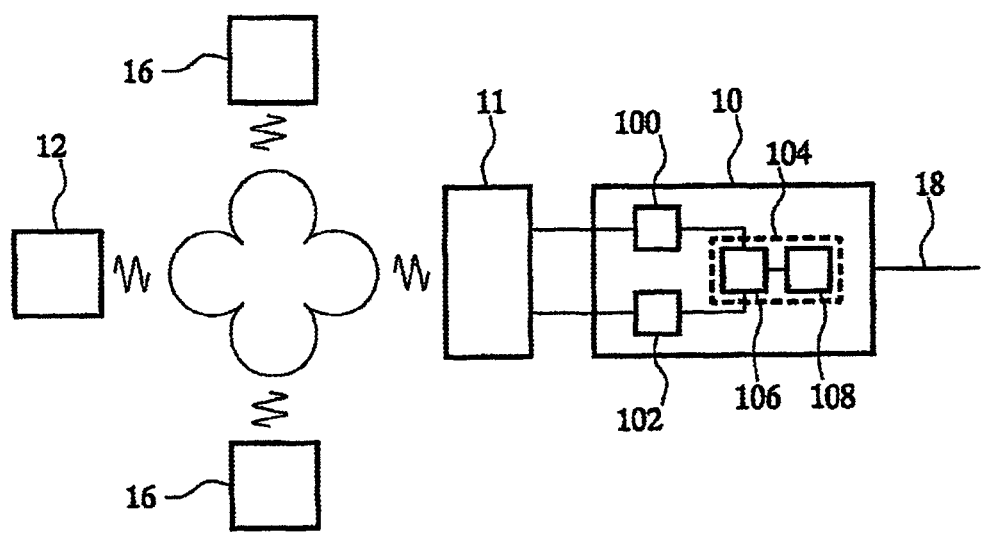
FIG. 1 shows a home network

FIG. 1 shows a home network comprising a control device 10, a wireless router 11, a settopbox 12 coupled to a display unit 14 and various other network stations 16. Control device 10 is coupled to wireless router 11. Control device 10 comprises a network transmitter 100 and a network receiver 102 coupled to wireless router 11, as well as a processing circuit 104 coupled to network transmitter 100 and network receiver 102 and comprising a programmable processor 106 and a program memory 108. By way of example control device 10 is shown having a connection 18 to a further network (not shown).

Router 11 and settopbox 12 may be configured to communicate via a wireless medium, using the IP protocol. Messages are generated in an application layer of control device 10 and the data from the messages is placed into signal packets that are transmitted via the medium. In settopbox 12 the data from the signal packets is reassembled into messages. Data from the messages may be processed by successive layers of hardware and/or software, such as an application layer, a UDP/TCP layer, an Internet layer a link layer and a physical layer successively. The signal packets that pass over the physical layer are formed by the intervening layers from data from messages supplied from the application layer.

The number of signal packets that is needed to transmit the data from a message depends the properties of the system and on the amount of data in the message (its length). The maximum amount of data that can be included in a message without resulting in transmission of more than one signal packet is a fixed quantity. This maximum amount can be derived from the specification of the layers, or it may be determined based on experimentation with router 11. This maximum amount will be called the fragmentation threshold. In many systems the fragmentation threshold is known as the maximum transfer unit (MTU).

In operation control device 10 is used to transmit a video stream from connection 18 to settopbox 12 via the wireless medium in response to a reception of request from settopbox 12. Before or during transmission of the video stream, probe software in control device 10 causes control device 10 to probe the transmission capacity of the medium, using a special type of packet pair dispersion measurement. Dependent on the result of probing, control device 10 may adapt the video stream bit rate or send a warning message back to settopbox 12.

Figure 2:
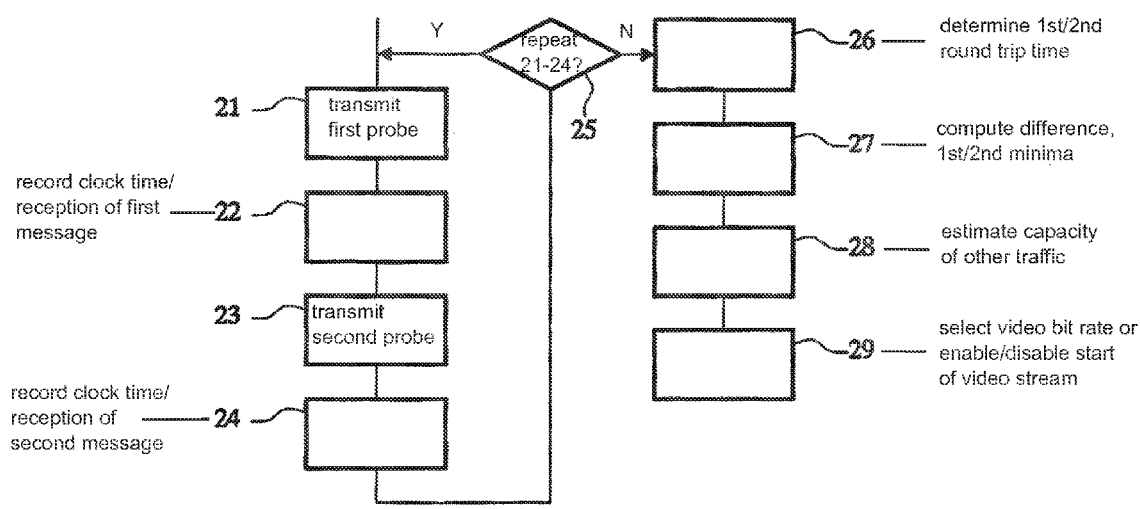
FIG. 2 shows a flow chart of a capacity measurement process

FIG. 2 shows a flow chart of an embodiment of probing by control device 10. In a first step 21 the probe software causes control device 10 to transmit a first probe addressed to an inactive port of settopbox 12 and records the clock time value at the time of transmission. A UDP message (Universal Datagram Protocol) may be used. The amount of data in the first message is made less than or equal to the fragmentation threshold.

Settopbox 12 will respond to the first probe message with a first error message because it is addressed to an inactive port of settopbox 12. Settopbox 12 transmits the first error message to control device 10 via the wireless medium and router 11 each in a single signal packet.

In a second step 22 the probe software causes control device 10 to detect reception of the first error message and to record clock time value at the time of reception. The probe software causes control device 10 to compute a first round trip time duration value between transmission of the first message and the first error message in response to the first message.

In a third step 23 the probe software causes control device 10 to transmit a second probe message addressed to the inactive port of settopbox 12 and records the clock time value at the time of transmission. A UDP message (Universal Datagram Protocol) may be used. The amount of data in the second message is set between the fragmentation threshold and twice the fragmentation threshold. In a fourth step 24 the probe software causes control device 10 to detect reception of a second error message in response to the second message and to record clock time value at the time of reception. The probe software causes control device 10 to compute a second round trip time duration value between transmission of the second probe message and the second error message in response to the first message.

In a fifth step 25 probe software causes control device 10 to decide whether first to fourth steps 21-24 will be repeated. These steps are repeated a predetermined number of times N, e.g. N=100. Control device 10 records the first and second round trip time durations for all repetition. Once the predetermined number of repetitions has been executed, a sixth step 26 is executed, wherein probe software causes control device 10 to determine a first minimum: the minimum first round trip time duration that was recorded for the repetitions and a second minimum: the minimum second round trip time duration that was recorded for the repetitions. When the number of repetitions N is sufficiently large, the first minimum is expected to represent the round trip time needed in the case of transmission with a single signal packet absent competing traffic. Similarly, the second minimum is expected to represent the round trip time needed in the case of transmission with two signal packets from control device 10 to settopbox 12 absent competing traffic. The minima need not have occurred for the same repetition. In a seventh step 27 probe software causes control device 10 to compute the difference D between the second minimum and the first minimum.

The second probe message is used for a pair dispersion measurement. As is known per se, when back to back packets are transmitted via a bottlenecked transmission channel, the narrowest part of the channel, i.e. the part of the channel that supports the lowest data rate, determines the time delay from the start of arrival of the first packet to the start of arrival of the second packet. Thus, absent disturbances, this delay is a measure of capacity. When transmission from control circuit 10 to settopbox 12 via router 11 and a wireless home network is used, typically the bottleneck is the wireless network. At best the signal packets with the data from the second probe message travel back to back via this wireless network. Conventionally, the ratio between the amount of data in the earliest signal packet and duration between the start of reception of earliest and the subsequent packet is used to compute the capacity.

In the present case, round trip time durations until reception of a response back at the source of the probe messages are used. The signal packets resulting from the second probe message are used for a pair dispersion measurement. The signal packet resulting from the first probe message is used as a reference to eliminate the contribution of the first signal packet for the second probe message and the contribution of the path back to control circuit 10 from the pair dispersion measurement.

Figure 3:
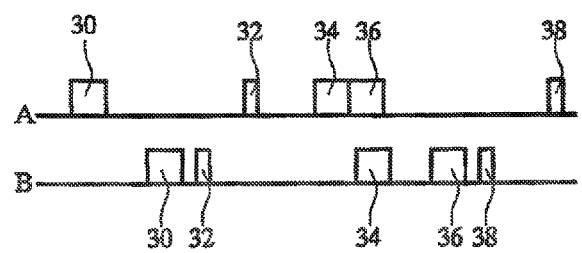
FIG. 3 illustrates timing of signal packets

FIG. 3 illustrates the timing in this experiment absent disturbances from other message traffic. A number of signal packets is shown along two time lines A, B, one at control circuit 10 and one at settopbox 12. A first signal packet 30 is shown that carries data from the first probe message transmitted from control device 10 and received by settopbox 12. The delay between the start of transmission from control device 10 and the end of reception at settopbox 12 includes the time needed for signal travel time plus a time duration of transmission of the signal packet in the slowest part of the communication path from control device 10 to settopbox 12 (typically the wireless network). Upon completion of reception of signal packet 30, settopbox 12 transmits a response 32 back to control device 12 which undergoes delays for similar reasons, but when an asymmetric communication protocol is used, the actual delays may be different.

Third and fourth signal packets 34, 36 are shown that are transmitted with data from the second probe message. These signal packets are transmitted back to back from control device 10, but they arrive with a time separation at settopbox 12. The time delay between the end of reception of the third and fourth signal packets 34, 36 corresponds to the time duration needed to transmit the data from the fourth signal packet 36 along the slowest part of the communication path from control device 10 to settopbox 12. The time delay from the end of reception of the fourth packet 36 to reception of the response to the second probe message is similar to that for the first probe message. Settopbox sends back a response packet 38 when the signal packets 34, 36 with the data from the second probe message have been received.

When the amount of data in the first signal packet 30 and the third signal packet 32 is the same, the difference between the round trip times for the first and second probe message is due solely to the extra time duration from reception of the third signal packet 34 and the fourth signal packet 36. As noted, this extra time duration corresponds to the time duration needed to transmit the data from the fourth signal packet 36 along the slowest part of the communication path from control device 10 to settopbox 12. Hence, transmission capacity along this part can be determined from a ratio between the amount of data in the fourth packet 26 and the difference between the round trip time durations.

In the illustrated embodiment, this difference is computed from the difference between the first and second minima. When the number of repetitions N is sufficiently large, this difference D is expected to represent excess time needed for transmitting two packets instead of one from control device 10 to settopbox 12, absent competing traffic. Of course, when it may be assumed that there is no competing traffic a single measurement of the round trip time duration values for the first and second probe messages may suffice.

The difference D is used to estimate the transmission capacity C0 between control device 10 and settopbox 12 absent other traffic. When the amount of data A1 in the first probe message is equal to the fragmentation threshold the signal packet for the first probe message has the same length as the first signal packet for the second probe message. In this case the capacity may be computed by dividing difference (A2−A1) by the difference D.

This computation remains valid even if the amount of data A1 in the first probe message is less than the fragmentation threshold, as the difference D can then be attributed to transmission time in the slowest part of the path for the surplus in the first signal packet for the second probe message plus the second signal packet.

In an embodiment the amount of data in the second probe message is selected to fill substantially two maximum length signal packets. In this way overhead effects are minimized. However, smaller or larger amounts of data may be used. The expression for capacity remains valid for any number of signal packets for the first and second probe message In another embodiment, the amount of data in the second probe message may exceed M times the fragmentation threshold (M>2). Similarly, the amount of data in the first probe message may exceed the fragmentation threshold. In each embodiment capacity may be computed by dividing the difference between the amounts of data in the first and second probe message and the difference D.

Control device 10 may execute an eight step 28 to estimate the capacity C1 used by other traffic and to subtract this from the measured transmission capacity C0. The remainder C0−C1 is used as an indication of the available capacity. When a video stream is transmitted, control device 10 may execute a ninth step 29 selecting the video bit rate (compression rate) and/or whether the starting of the video stream should be enabled or disabled, generating a warning message dependent on this available capacity.

In an embodiment the capacity used by communication traffic of other devices is estimated by means of pairs of further probe messages, with a time interval between transmission of the further probe messages of each pair. The duration T of this time interval may be selected according to the difference D between the round trip time duration values of the first and second probe messages, with T equal to D. Without other traffic such messages should travel through the network unhindered by each other, keeping the same time separation T. When the time separation has increased upon arrival this can be attributed to other traffic that is carried by the network between the messages.

The average capacity used by such other traffic may be estimated by sending such pairs repeatedly and taking an average of the increased difference <DT> on arrival of the response. The rate of other traffic C1 can be quantified by multiplying the capacity C0 by a ratio between the average <DT> and the average round trip time of the messages. Although an embodiment has been shown wherein the further messages are transmitted with a time difference T=D, it should be appreciated that a larger or smaller difference may be used, as long as the contribution D-T of delay due to the lowest transmission rate when T<D or the contribution of a fraction of undetectable delays with DT<T-D when T>D is accounted for. It should be emphasized that this is only one example of how capacity used by other traffic can be measured many alternative solutions exist.

In an embodiment, the first and/or second probe messages may double as further probe messages. That is, such a message may be used in combination with a first other message for the estimation of the measured transmission capacity C0 and in combination with another message for the estimation of capacity C1 used by other traffic.

It may be noted that the use of at least one probe messages with a length above the fragmentation threshold in the round trip measurement process of FIG. 2 has the advantage auto-interference between the probe message and the response to it cannot disturb the measurement. The data from at least the longest probe message is transmitted by means of at least two signal packets. The response (e.g. an error message) is transmitted when the entire longest probe message has been transmitted, i.e. after transmission of a plurality of signal packets, so that its transmission cannot interfere with the arrival of those signal packets. This should be contrasted with an experiment wherein back to back probe messages are use that each give rise to one signal packet. When a round trip measurement is performed in that case, the timing of the second probe message and the response to the first probe message will interfere, giving rise to an unreliable capacity estimation.

Secondly, the independent determination of the first and second minima has the advantage that for both minima cases are eliminated wherein the round trip has been delayed due to interference with traffic from other devices 16 that use the wireless network. The use of UDP messages (that is, messages that do not elicit acknowledgement and whose transmission is not supported by a retry protocol or parameter adjustment in the case of no delivery) makes it possible to control capacity measurement from the application layer. Furthermore it should be noted that the use of error messages in the return path ensures that the effect of the return path on the differences between the first and second round trip time duration will be minimal, without requiring special measures on the side of settopbox 12. Although in one embodiment the error messages are always elicited by transmitting messages to the same inactive (or unsupported) port, it should be appreciated that messages to any (and variable) inactive (or unsupported) ports may be used. However, in another embodiment instead of error messages, other responses to messages may be used.

An example has been shown wherein control device 10 operates under control of a computer program that specifies execution of the described steps. As used herein, this is expressed by saying that the processing circuit 104 of control device 10 is configured to perform these actions. However, it should be understood that instead a dedicated circuit may be used to perform these actions. Such a circuit will also be referred to as a processor circuit configured to perform these actions.

Although an example is given wherein the estimated capacity is applied to control the bit rate (i.e. the compression rate) of a video stream, it should be appreciated that other applications are possible, such as control of an audio stream and/or control over starting or delaying of execution of a processing task dependent on whether a network capacity needed for the task is available.

Although an example is given wherein capacity between a control device 10 and a settopbox 12 is measured, it should be appreciated that capacity between a first and second network node of any type instead of a control device 10 and a settobnox 12 can be measured in the described way.

According to one aspect packet pair dispersion measurements are performed using UDP messages sent to unused UDP ports of a destination node. This results in small UDP error packets.

As described capacity is determined according to A/(min(RTT2)−min(RTT1)) wherein A is an amount of data, RTT2 and RTT1 are round trip time values and "min" indicates that a minimum detected in a series of repetitions. This can be applied independent of use of fragmentation or UDP and error messages. Instead of an absolute minimum a near minimum value may be used, such as a value ranking at a predetermined rank in a ranking of round time values according to ascending round trip time values.

When a shared medium such as a wireless medium is used, it is advantageous to perform packet pair dispersion measurements using a message with a length above the fragmentation threshold, e.g. with a length A+MTU (with A preferably equal to MTU, MTU being the fragmentation threshold, waiting or a response and determining a round trip time value.

The invention claimed is:

1. A method of measuring transmission capacity from a first node to a second node through a communication network, the method comprising
   repeatedly transmitting first and second probe messages, having respective first and second amounts of data from the first node to the second node, wherein one of the first and second amounts exceeds a fragmentation threshold of the communication network, and the other of the first and second amounts is less than or equal to the fragmentation threshold;
   repeatedly measuring first and second round trip time durations between transmission of the first and second probe messages from the first node and reception back at the first node of first and second response messages from the second node to the first and second probe messages respectively;
   computing the transmission capacity based on the first and second amounts of data in the probe messages being different and from a difference between first and second minimal values of the first and second round trip time durations, respectively.

2. A method according to claim 1, wherein the capacity is computed from a ratio of a difference between the second and first amounts of data (A1, A2) and the difference between the first and second minimal values of the first and second round trip time durations.

3. A method according to claim 1, wherein the first and second probe message are addressed to an inactive port of the second node, the first and second response message being error messages that report that the port is inactive.

4. A method according to claim 1, wherein the first and second probe messages are Universal Datagram Protocol (UDP) messages.

5. A method according to claim 1, wherein the communication network comprises a wireless network in a communication path between the first node and the second node.

6. A method according to claim 1, comprising controlling a bit rate of a video stream dependent on the computed capacity.

7. A control device for use in a communication network, the control device comprising a network transmitter, a network receiver and a processing circuit configured to repeatedly submit first and second probe messages, having respective first and second amounts of data, to the network transmitter addressed to a node in the communication network, wherein one of the first and second amounts exceeds a fragmentation threshold of the communication network, and the other of the first and second amounts is less than or equal to the fragmentation threshold; to repeatedly measure first and second round trip time durations between transmission of the first and second probe messages and reception back at the network receiver of first and second response messages from the node to the first and second probe messages respectively; and to compute the transmission capacity based on the first and second amounts of data in the probe messages being different and from a difference between first and second minimal values of the first and second round trip time durations, respectively.

8. A control device according to claim 7, wherein the first and second probe messages are Universal Datagram Protocol (UDP) messages.

9. A control device according to claim 7, wherein the processing circuit is configured to control a bit rate of a video stream dependent on the computed capacity.

10. A communication system comprising a control device according to claim 7, a node to which the first and second probe messages are addressed and a wireless communication network, a communication path between the control device and the node running through the wireless communication network.

11. A computer program product comprising a non-transitory computer readable medium having a computer program embodied thereon, the computer program including instructions for a programmable processor that, when executed by the programmable processor, causes the programmable processor to
- repeatedly submit first and second probe messages, having respective first and second amounts of data to a network transmitter addressed to a node in a communication network, wherein at least one of the first and second amounts exceeds a fragmentation threshold of the communication network; to
- repeatedly measure first and second round trip time durations between transmission of the first and second probe messages and reception back at the network receiver of first and second response messages from the node to the first and second probe messages respectively; and to
- compute a network transmission capacity based on the first and second amounts of data in the probe messages being different and from a difference between first and second minimal values of the first and second round trip time durations, respectively.

12. A method of measuring transmission capacity from a first node to a second node through a communication network, the method comprising
- repeatedly transmitting first and second UDP messages from the first node to at least one unused UDP port of the second node, whereby the first and second UDP messages result in UDP error packets because the at least one UDP port is not in use;
- repeatedly measuring first and second round trip time durations between transmission of the first and second UDP messages, respectively and reception of the UDP error packets;
- computing the transmission capacity based on amounts of data in the first and second UDP messages being different and from a difference between first and second minimal values of the first and second round trip time durations.

13. A method of measuring transmission capacity from a first node to a second node through a communication network, the method comprising
- repeatedly transmitting pairs of back to back messages from the first node to the second node;
- repeatedly measuring round trip time durations between transmission of the messages and reception of responses to the messages;
- determining first and second minimal values of round trip time durations of first and second back to back messages in the pairs respectively;
- computing the transmission capacity based on amounts of data in the back to back messages being different and from a difference between the first and second minimal values.

* * * * *